United States Patent
Rueger

(10) Patent No.: US 8,256,293 B2
(45) Date of Patent: *Sep. 4, 2012

(54) DEVICES COMPRISING NANOTUBES FOR USE AS SENSORS AND/OR TRANSDUCERS, AND RELATED METHODS

(75) Inventor: Neal R. Rueger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 39 days.

This patent is subject to a terminal disclaimer.

(21) Appl. No.: 12/901,937

(22) Filed: Oct. 11, 2010

(65) Prior Publication Data

US 2011/0023608 A1 Feb. 3, 2011

Related U.S. Application Data

(63) Continuation of application No. 11/767,962, filed on Jun. 25, 2007, now Pat. No. 7,819,005.

(51) Int. Cl.
*G01N 29/04* (2006.01)
*H02N 2/18* (2006.01)

(52) U.S. Cl. .......... 73/579; 73/597; 73/649; 310/323.06

(58) Field of Classification Search .................. 73/579, 73/597, 649; 310/23.06, 36, 37, 323.06; 423/447.3

See application file for complete search history.

(56) References Cited

U.S. PATENT DOCUMENTS

| | | | |
|---|---|---|---|
| 6,087,654 A * | 7/2000 | Durham, III | 250/231.13 |
| 6,400,088 B1 | 6/2002 | Livingston et al. | |
| 6,718,834 B1 | 4/2004 | Sood et al. | |
| 6,803,840 B2 | 10/2004 | Hunt et al. | |
| 6,919,730 B2 | 7/2005 | Cole et al. | |
| 6,946,851 B2 | 9/2005 | Lee et al. | |
| 6,949,931 B2 | 9/2005 | Cole et al. | |
| 6,997,039 B2 | 2/2006 | Rao et al. | |

(Continued)

FOREIGN PATENT DOCUMENTS

JP 06310976 A 11/1994

(Continued)

OTHER PUBLICATIONS

Ciocan et al., "Determination of the Bending Modulus of an Individual Multiwall Carbon Nanotube Using an Electric Harmonic Detection of Resonance Technique," Nano Letters, vol. 5, No. 12, 2389-2393 (2005).

(Continued)

*Primary Examiner* — J M Saint Surin
(74) *Attorney, Agent, or Firm* — TraskBritt

(57) ABSTRACT

Devices usable as sensors, as transducers, or as both sensors and transducers include one or more nanotubes or nanowires. In some embodiments, the devices may each include a plurality of sensor/transducer devices carried by a common substrate. The sensor/transducer devices may be individually operable, and may exhibit a plurality of resonant frequencies to enhance the operable frequency bandwidth of the devices. Sensor/transducer devices include one or more elements configured to alter a resonant frequency of a nanotube. Such elements may be selectively and individually actuable. Methods for sensing mechanical displacements and vibrations include monitoring an electrical characteristic of a nanotube. Methods for generating mechanical displacements and vibrations include using an electrical signal to induce mechanical displacements or vibrations in one or more nanotubes. Methods for adjusting an electrical signal include passing an electrical signal through a nanotube and changing a resonant frequency of the nanotube.

25 Claims, 4 Drawing Sheets

U.S. PATENT DOCUMENTS

| | | |
|---|---|---|
| 7,052,588 B2 | 5/2006 | Gu et al. |
| 7,057,402 B2 | 6/2006 | Cole et al. |
| 7,112,816 B2 | 9/2006 | Schlaf et al. |
| 7,129,467 B2 | 10/2006 | Wincheski et al. |
| 7,183,568 B2 | 2/2007 | Appenzeller et al. |
| 7,489,211 B2 | 2/2009 | Naito et al. |
| 7,711,213 B2 * | 5/2010 | Wang et al. ............. 385/2 |
| 7,819,005 B2 * | 10/2010 | Rueger ................... 73/579 |
| 2004/0004485 A1 | 1/2004 | Lee et al. |
| 2004/0100269 A1 | 5/2004 | Cole et al. |
| 2004/0104129 A1 | 6/2004 | Gu et al. |
| 2005/0036905 A1 | 2/2005 | Gokturk |
| 2005/0053525 A1 | 3/2005 | Segal et al. |
| 2005/0065741 A1 | 3/2005 | Segal et al. |
| 2005/0129178 A1 | 6/2005 | Pettit |
| 2005/0255032 A1 | 11/2005 | Cole et al. |
| 2005/0265914 A1 | 12/2005 | Gu et al. |
| 2006/0010996 A1 | 1/2006 | Jordan et al. |
| 2006/0125033 A1 | 6/2006 | Segal et al. |
| 2006/0169585 A1 | 8/2006 | Nagahara et al. |
| 2006/0204428 A1 | 9/2006 | Noy et al. |
| 2006/0237805 A1 | 10/2006 | Segal et al. |
| 2006/0283262 A1 | 12/2006 | Smits et al. |
| 2008/0067618 A1 | 3/2008 | Wang et al. |
| 2008/0067619 A1 | 3/2008 | Farahani et al. |
| 2008/0129278 A1 | 6/2008 | Dai et al. |
| 2008/0216558 A1 | 9/2008 | Koyilothu et al. |
| 2008/0264185 A1 | 10/2008 | Kobayashi et al. |
| 2009/0170209 A1 | 7/2009 | Machauf et al. |

FOREIGN PATENT DOCUMENTS

| | | |
|---|---|---|
| WO | 2008111728 A1 | 9/2008 |

OTHER PUBLICATIONS

Dresselhaus et al., Carbon Nanotubes Synthesis, Structure, Properties, and Applications, Topics Appl. Phys. vol. 80, pp. 1-109 (2001).

Dume, http://pysicsworld.com/cws/article/news/20265, Nanotubes Feel the Force, IOP Website from the Institute of Physics, Sep. 2004, 2 pages.

Dume, Ultrasound Drives Nanogenerator, http://nanotechweb.org/articles/news/6/4/4/1 (Apr. 2007).

Pushparaj et al., "Effects of compressive strains on electrical conductivities of a macroscale carbon nanotube block," Applied Physics Letters 91, 153116, 3 pages, (2007).

Stampfer et al., "Nano-Electromechanical Displacement Sensing Based on Single-Walled Carbon Nanotubes," Nano Letters, vol. 6, No. 7, 1449-1453 (2006).

* cited by examiner

DEVICES COMPRISING NANOTUBES FOR USE AS SENSORS AND/OR TRANSDUCERS, AND RELATED METHODS

CROSS-REFERENCE TO RELATED APPLICATION

This application is a continuation of U.S. patent application Ser. No. 11/767,962, filed Jun. 25, 2007, now U.S. Pat. No. 7,819,005 issued on Oct. 26, 2010. The disclosure of which is hereby incorporated herein by this reference in its entirety.

FIELD OF THE INVENTION

Embodiments of the present invention relate to sensors, transducers, and other devices comprising carbon nanotubes, and to methods of making and using such devices.

BACKGROUND OF THE INVENTION

Nanotubes are small tubular structures that are conventionally formed primarily from covalently bonded carbon atoms, although nanotubes formed of other materials (e.g., gallium nitride, boron nitride, carbon nitride, and transition metal sulfides, selenides, halogenides, and oxides) have also been produced. Nanotubes are a relatively recently discovered form of matter. Since their discovery, nanotubes have been formed having various diameters, lengths, compositions, and structural forms (i.e., chirality, or twist). The physical, electronic, and thermal properties that may be exhibited by nanotubes vary broadly and are at least partially a function of one or more of the size, composition, and structure of the nanotubes. For example, nanotubes may be electrically conductive, semiconductive, or nonconductive.

Nanotubes may be formed as so-called single wall nanotubes (SWNTs), or they may be formed as so-called multiple wall nanotubes (MWNTs). Single wall nanotubes have a single wall of covalently bonded atoms, whereas multiple wall nanotubes include two or more generally concentric walls of covalently bonded atoms. Multiple wall nanotubes may be visualized as one or more nanotubes positioned within another nanotube.

Various techniques may be used to fabricate nanotubes including, for example, chemical vapor deposition (CVD) methods, arc discharge methods, and laser ablation methods. A background discussion of carbon nanotubes, as well as methods for fabricating nanotubes can be found in, for example, Dresselhaus et al., *Carbon Nanotubes: Synthesis, Structure, Properties, and Applications*, Topics Appl. Phys., vol. 80, pp. 1-109 (Springer 2001), the disclosure of which is incorporated herein in its entirety by this reference.

It is known that some physical properties of nanotubes vary with mechanical deformation. For example, it has been shown that the electrical resistance of a carbon nanotube varies when mechanical deformation (i.e., strain) is induced in the carbon nanotube. See, for example, R. Ciocan et al., *Determination of the Bending Modulus of an Individual Multiwall Carbon Nanotube Using an Electric Harmonic Detection of Resonance Technique*, Nano Letters, vol. 5, no. 12, 2389-2393 (2005), C. Stampfer et al., *Nano-Electromechanical Displacement Sensing Based on Single-Walled Carbon Nanotubes*, Nano Letters, vol. 6, no. 7, 1449-1453 (2006), the disclosure of each of which is incorporated herein in its entirety by this reference. Furthermore, it has been proposed in the art to employ nanotubes in sensor devices. See, for example, United States Patent Application Publication No. 2004/0004485 A1, published Jan. 8, 2004, United States Patent Application Publication No. 2006/0010996 A1, published Jan. 19, 2006, and United States Patent Application Publication No. 2006/0283262 A1, published Dec. 21, 2006, the disclosure of each of which is also incorporated herein in its entirety by this reference.

There remains a need in the art for sensors, transducers, and other devices that employ the unique characteristics and properties of nanotubes in other and further applications, and for methods of making and using such devices.

DETAILED DESCRIPTION

As used herein, the term "nanotube" means and includes any elongated tubular structure having a length and an average diameter, the average diameter being less than about two hundred nanometers (200 nm). Nanotubes include single walled nanotubes (SWNTs) and multiple walled nanotubes (MWNTs), and may comprise, for example, carbon nanotubes as well as nanotubes comprising other materials such as, by way of non-limiting example, III-V type semiconductor materials, II-VI type semiconductor materials, boron nitride, carbon nitride, metals, and transition metal sulfides, selenides, halogenides, and oxides.

As used herein, the term "III-V type semiconductor material" means and includes any material predominantly comprised of one or more elements from group IIIB of the periodic table (B, Al, Ga, In, and Tl) and one or more elements from group VB of the periodic table (N, P, As, Sb, and Bi).

As used herein, the term "II-VI type semiconductor material" means and includes any material predominantly comprised of one or more elements from group IIB of the periodic table (Zn, Cd, and Hg) and one or more elements from group VIB of the periodic table (O, S, Se, Te, and Po).

As used herein, the term "sensor/transducer device" means and includes any device that is suitable for use as a sensor device for sensing mechanical movement, as a transducer device for generating mechanical movement from other forms of energy, or as both a sensor device and a transducer device for both sensing mechanical movement and generating mechanical movement. As used herein, the term "mechanical movement" includes any physical movement of matter in space and includes any physical displacement of matter (e.g., strain in a material), as well as vibrations in matter and waves (e.g., acoustical waves, ultrasonic waves, seismic waves, etc.) initiated in surrounding matter, including without limitation fluid matter.

The illustrations presented herein are not meant to be actual views of any particular device or system, but are merely idealized representations that are employed to describe the present invention. Additionally, elements common between figures may retain the same numerical designation.

Figure 1:
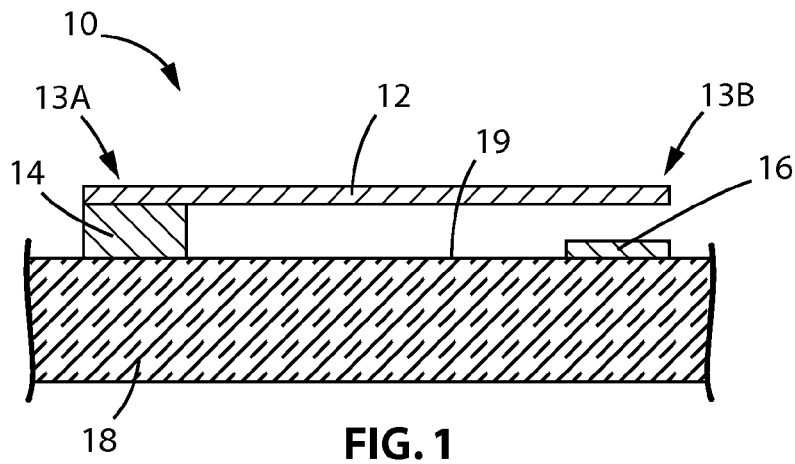
FIG. 1 is a side view of a portion of a first embodiment of a sensor/transducer device of the present invention that includes one or more nanotubes and is suitable for use as a sensor, as a transducer, or as both a sensor and a transducer.

A first embodiment of a sensor/transducer device 10 of the present invention is shown in FIG. 1. As will be discussed in further detail below, the sensor/transducer device 10 may be used as a sensor device, as a transducer device, or as both a sensor device and a transducer device.

The sensor/transducer device 10 includes at least one conductive or semiconductive nanotube 12 having a first end 13A structurally and electrically coupled to a first electrode 14 and a second, free end 13B positioned proximate, but separated from, a second electrode 16. The first electrode 14 may be used to structurally secure (i.e., anchor) the first end 13A of the nanotube 12 to a surface 19 of a substrate 18. As shown in FIG. 1, in some embodiments, the second end 13B of the nanotube 12 may be positioned vertically over the second electrode 16. In additional embodiments, however, the second end 13B of the nanotube 12 may be positioned vertically under a second electrode, laterally beside a second electrode, or in any other position relative to the second electrode 16 such as, without limitation, within an end of a tubular or otherwise hollow second electrode.

The substrate 18 may comprise any of a number of materials including polymers, ceramics, metals, and semiconductor type materials. By way of example and not limitation, the substrate may comprise a silica or sapphire type substrate. In additional embodiments, the substrate 18 may comprise a wafer. As used herein, the term "wafer" means any structure that includes a layer of semiconductor type material including, for example, silicon, germanium, gallium arsenide, indium phosphide, and other III-V or II-VI type semiconductor materials. Wafers include, for example, not only conventional wafers but also other bulk semiconductor substrates such as, by way of non-limiting example, silicon-on-insulator (SOI) type substrates, silicon-on-sapphire (SOS) type substrates, and epitaxial layers of silicon supported by a base material. Semiconductor type materials may be doped or undoped. If the bulk material of the substrate 18 is not electrically insulative, a dielectric material (not shown) may be used to electrically isolate the first electrode 14 and the second electrode 16 from the bulk material of the substrate 18.

Although not shown in FIG. 1, additional conductive structures including, for example, conductive traces, conductive vias, and conductive pads may be formed on the substrate 18, in the substrate 18, or both on and in the substrate 18 for communicating electrically with the first electrode 14 and the second electrode 16 of the sensor/transducer device 10.

In this configuration, a voltage may be applied to the first electrode 14 (and, hence, the nanotube 12, which is in electrical contact with the first electrode 14) to generate or affect a capacitance between the nanotube 12 and the second electrode 16. The capacitance between the first electrode 14 and the second electrode 16 may at least partially depend on the distance between the second end 13B of the nanotube 12 and the second electrode 16. The sensor/transducer device 10 then may be used to detect any change in the capacitance between the first electrode 14 and the nanotube 12, which would indicate a change in the distance between the second end 13B of the nanotube 12 and the second electrode 16. Such changes might be induced by, for example, mechanical movement of or in the substrate 18, or mechanical movement in a medium surrounding the nanotube 12.

In one particular non-limiting embodiment, the sensor/transducer device 10 may be used as an acoustical sensor device for detecting and characterizing sound waves (i.e., an audible signal). The electrical signal (i.e., waveform) of the capacitance between the first electrode 14 and the nanotube 12 may be a function of one or more characteristics of the sound waves (e.g., the frequency of the sound and the sound pressure). This electrical signal generated by the sensor/transducer device 10 may optionally be reproduced and amplified, either as a graphic waveform, or as physical sound (i.e., an audible signal) using conventional audio reproduction methods.

In an additional non-limiting embodiment, the sensor/transducer device 10 may be used as a sensor for detecting and characterizing mechanical movements other than sound waves. Any movement of or in, the substrate 18 (e.g., mechanical strain in the substrate 18 or in a medium surrounding the nanotube 12) may cause a change in the distance between the second end 13B of the nanotube 12 and the second electrode 16. Such a change may be detected as a change in the capacitance between the first electrode 14 and the nanotube 12 in the same manner as that previously discussed. The electrical signal generated by the sensor/transducer device 10 may optionally be reproduced and amplified, and used to characterize the movement that has been detected using the sensor/transducer device 10.

In yet additional embodiments, the sensor/transducer device 10 also may be used as a transducer for generating mechanical movement from other forms of energy, such as, for example, electrical energy. By way of example and not limitation, a voltage may be provided between the first electrode 14 and the second electrode 16, and the magnitude and/or polarity of the voltage may be selectively varied. As the magnitude and/or polarity of the voltage is selectively varied, electrostatic forces may be selectively applied between the nanotube 12 and the second electrode 16, and these electrostatic forces may induce movement or vibrations of the free second end 13B of the nanotube 12. In other words, the electrostatic forces may be used to selectively induce movement or vibrations in the nanotube 12. The movement or vibrations may be transmitted through the substrate 18, or through a medium surrounding the nanotube 12.

In FIG. 1, the nanotube 12 is illustrated as being suspended in air. In additional embodiments, however, the nanotube 12 may be suspended in, and surrounded by, a gas, a liquid, a solid material, or any other medium, or the nanotube 12 may be disposed in a vacuum. In all but the latter case, the mechanical movement (e.g., vibrations) of the nanotube 12 may be transmitted through the surrounding medium (i.e., matter), through the substrate 18, or through both the surrounding medium and the substrate 18. If the nanotube 12 is disposed in a vacuum, the mechanical movement (e.g., vibrations) of the nanotube 12 may be transmitted through the substrate 18.

In view of the above, the sensor/transducer device 10 may be used as both an emitter of mechanical or acoustical waves or vibrations, and as a receiver (i.e., a detector or sensor) of mechanical or acoustical waves or vibrations.

As one particular non-limiting example of a manner in which the sensor/transducer device 10 may be used, the sensor/transducer device 10 may be embedded in a material or materials (e.g., a laminate) of any other product or device and used to detect formation of cracks or defects therein. For example, a sensor/transducer device 10 may be embedded in a microelectronic device (e.g., an electronic signal processor device or an electronic memory device). An electrical pulse or signal may be used to generate and emit a mechanical wave in the surrounding medium or media of the microelectronic device. Any defects or cracks in the surrounding medium or media of the microelectronic device may reflect one or more waves emitted from the sensor/transducer device. Therefore, after emission of the wave, the capacitance between the first electrode 14 and the second electrode 16 may be monitored to detect any reflections of the wave. The electrical signal that is generated or modulated by the variation in capacitance caused by the reflected waves may be analyzed and used to detect and characterize any defect or defects within the microelectronic device that caused the reflection of the emitted waves.

As previously described, in the embodiment of the sensor/transducer device 10 shown in FIG. 1, the capacitance between the nanotube 12 and the second electrode 16 may be monitored when using the sensor/transducer device 10 as a sensor to detect mechanical movement of the nanotube 12, and the voltage between the nanotube 12 and the second electrode 16 may be selectively varied when using the sensor/transducer device 10 as a transducer to generate mechanical movement of the nanotube 12. In additional embodiments of the invention, however, a complete electrical pathway (e.g., circuit) may be provided through a nanotube 12, and the current passing through the nanotube 12 may be monitored when using the device as a sensor.

Figure 2:
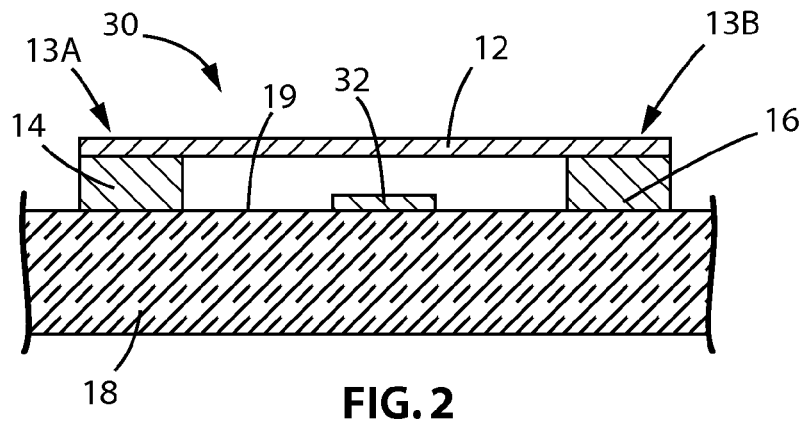
FIG. 2 is a side view of a portion of a second embodiment of a sensor/transducer device of the present invention that includes one or more nanotubes.

Such an embodiment of a sensor/transducer device 30 of the present invention is shown in FIG. 2, wherein sensor/transducer device 30 includes a complete electrical pathway that passes through a nanotube 12. The sensor/transducer device 30, like the previously described sensor/transducer device 10, may be used as a sensor, for detecting mechanical movement, as a transducer for generating mechanical movement, or as both a sensor and a transducer. The sensor/transducer device 30 includes at least one nanotube 12 extending between a first electrode 14 and a second electrode 16. For example, the first end 13A of the nanotube 12 may be structurally and electrically coupled to the first electrode 14, and the second end 13B of the nanotube 12 may be structurally and electrically coupled to the second electrode 16.

In this configuration, a voltage may be applied across the nanotube 12 between the first electrode 14 and the second electrode 16, and the magnitude of the resulting current passing through the nanotube 12 may be monitored. Deformation of the nanotube 12 may cause the magnitude of the current passing through the nanotube 12 to vary responsive to deformation-induced resistance variation exhibited by the nanotube 12. Therefore, any deflection of the nanotube 12 or vibrations of the nanotube 12 may be detected in the electrical signal (e.g., as a variance in the magnitude of the current passing through the nanotube 12).

Like the sensor/transducer device 10, the sensor/transducer device 30 may be formed on and/or in a substrate 18. Furthermore, the nanotube 12 may be suspended in air or any other medium, or the nanotube 12 may be suspended in a vacuum. Furthermore, the sensor/transducer device 30 may be used in any of the methods and applications previously described in relation to the sensor/transducer device 10 shown in FIG. 1.

Optionally, an additional conductive electrode 32 may be provided adjacent an intermediate section of the nanotube 12 at a location between the first electrode 14 and the second electrode 16, as shown in FIG. 2. For example, the additional electrode 32 may be formed on a surface 19 of the substrate 18. In this configuration, a capacitance may be provided between the nanotube 12 and the additional electrode 32 using the medium in the gap between the nanotube 12 and the additional electrode 32 as a dielectric for the capacitor so formed, and this capacitance may vary as the nanotube 12 is displaced or vibrates. Therefore, mechanical movement in the nanotube 12 may be detected by monitoring the capacitance between the nanotube 12 and the additional electrode 32. Additionally, deflections or vibrations in the nanotube 12 may be induced by generating a voltage (in the case of vibrations, varying the voltage) between the additional electrode 32 and the nanotube 12 (by way of one or both of the electrodes 14, 16). As a result, the sensor/transducer device 30 may be used as both a sensor of mechanical movement and as a transducer for generating mechanical movement (e.g., emitting mechanical vibrations or waves). In some embodiments, mechanical movement of the nanotube 12 may be detected and measured by measuring variations in the current flowing through the nanotube 12 between the first electrode 14 and the second electrode 16, and mechanical movement of the nanotube 12 may be induced by generating or varying a voltage, and hence an electrostatic force, between the additional electrode 32 and the nanotube 12.

As illustrated in the embodiments of the invention shown in FIGS. 1 and 2, the nanotubes 12 may be oriented in a generally horizontal direction relative to a surface 19 of a substrate 18. In additional embodiments of the invention, nanotubes 12 may be oriented in a substantially vertical direction relative to a surface 19 of a substrate 18.

Figure 3:
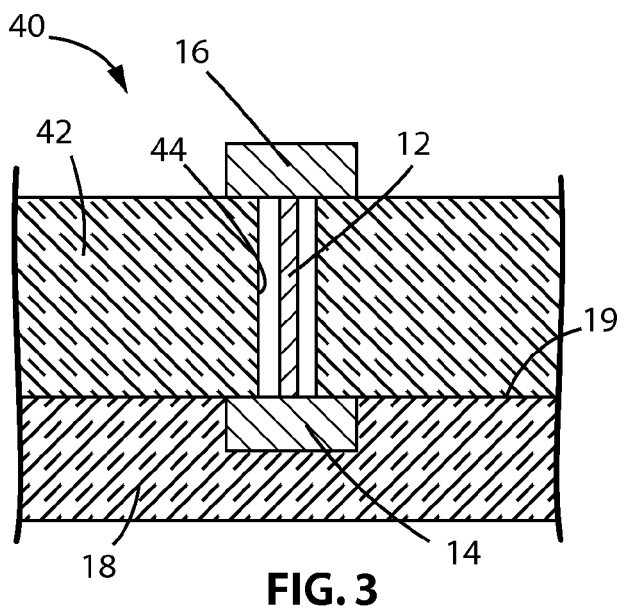
FIG. 3 is a side view of a portion of a third embodiment of a sensor/transducer device of the present invention that includes one or more nanotubes.

For example, FIG. 3 illustrates another embodiment of a sensor/transducer device 40 of the present invention. As shown in FIG. 3, the sensor/transducer device 40 includes a nanotube 12 that is oriented substantially vertically relative to a surface 19 of a substrate 18. The sensor/transducer device 40 extends between, and is electrically coupled to each of, a first electrode 14 and a second electrode 16. As shown in FIG. 3, in some embodiments, a layer of material 42 may be formed over the surface 19 of the substrate 18, and a via 44 may be formed in the layer of material 42. The nanotube 12 then may be formed or positioned within the via 44.

The first electrode 14 may be formed on or in the surface 19 of the substrate 18 prior to forming the layer of material 42 over the substrate 18, and the second electrode 16 may be formed over the exposed surface of the layer of material 42 such that the second electrode 16 surrounds and electrically contacts an end of the nanotube 12.

Figure 4:
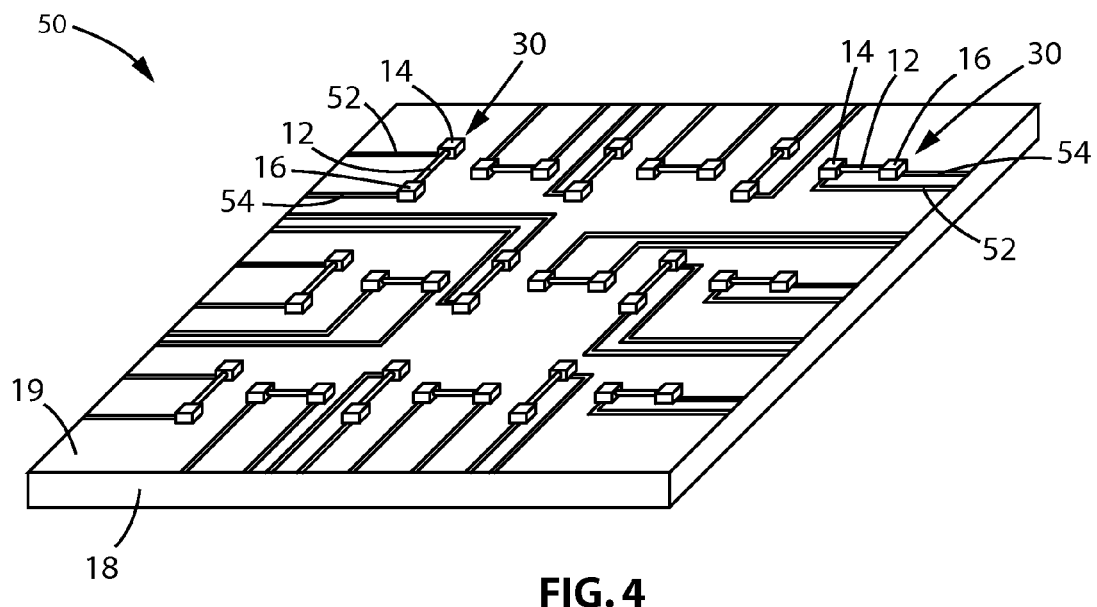
FIG. 4 is a perspective view of a fourth embodiment of a device of the present invention that includes a plurality of individual sensor/transducer devices, each including a nanotube, disposed in an array across a surface of a substrate.

Only one sensor/transducer device is shown in each of FIGS. 1-3. Embodiments of the present invention, however, may include a plurality of such sensor/transducer devices. By way of example and not limitation, FIG. 4 illustrates a portion of a device 50 that includes a plurality of individual sensor/transducer devices 30 similar to that previously described with reference to FIG. 2. As shown in FIG. 4, the device 50 includes a plurality of sensor/transducer devices 30 disposed in an array across a surface 19 of the substrate 18. Each of the sensor/transducer devices 30 includes a nanotube 12 extending between a first electrode 14 and a second electrode 16, as previously described in relation to FIG. 2. As shown in FIG. 4, conductive traces 52 that communicate electrically with the first electrodes 14 and conductive traces 54 that communicate electrically with the second electrodes 16 may be formed on or in the surface 19 of the substrate 18. These conductive traces 52, 54 may lead to, for example, other integral electronic devices or systems (not shown) formed on the substrate 18, or they may lead to contact pads (not shown) or other electrical contacts that may be used to establish electrical communication with other electronic devices or systems not formed on the substrate 18. Such electrical devices or systems may be used, for example, to control and/or monitor the individual sensor/transducer devices 30.

With continued reference to FIG. 4, some of the nanotubes 12 of the sensor/transducer devices 30 may be oriented in a first direction, and some of the nanotubes 12 of the sensor/transducer devices 30 may be oriented in a second direction that is substantially perpendicular to the first direction. In additional embodiments, the nanotubes 12 of the sensor/transducer devices 30 may be oriented in more than two (any number of) differing directions on the surface 19 of the substrate 18. Each sensor/transducer device 30 may be relatively more sensitive to waves impinging thereon in directions that are oriented at angles greater than zero (e.g., ninety degrees (90°)) relative to the lengths of the nanotubes 12. Therefore, mechanical movement in the substrate 18 and/or the medium surrounding the nanotubes 12 can be detected or generated in any number of directions using the device 50 by orienting the nanotubes 12 of the sensor/transducer devices 30 in a plurality of differing directions on the substrate 18.

The device 50 may be further configured to enable identification of the direction and speed of displacements or vibrations propagating through the substrate 18 or surrounding medium if the relative locations of the various devices 30 and the distances therebetween on the surface 19 of the substrate 18 are known. For example, the relative locations of the various sensor/transducer devices 30 and the distances therebetween on the surface 19 of the substrate 18 can be determined after the sensor/transducer devices 30 have been formed on the substrate 18, or they may be selected prior to forming the sensor/transducer devices 30 on the substrate 18.

If the locations and spacings of the sensor/transducer devices 30 are known, the direction and speed of mechanical movement (e.g., vibrations or waves) propagating through the substrate 18 or the medium surrounding the nanotubes 12 may be determined using timing methods. For example, as a wave propagates across the substrate 18 or through the medium surrounding the nanotubes 12, an electronic timer (e.g., a computer clock) may be used to measure the time T it takes for the wave to travel from a first sensor/transducer device 30 to a second sensor/transducer device 30. If the distance D between the first and second devices 30 is known, the velocity V of the wave may be determined using the equation (V=D/T). Furthermore, by detecting the wave as it impinges on at least some of the sensor/transducer devices 30, and the respective relative times at which the wave impinges on those sensor/transducer devices 30, the direction in which the wave is traveling also may be determined.

As previously mentioned, each of the sensor/transducer devices of the device 50 shown in FIG. 4 may comprise, for example, the sensor/transducer devices 10 previously described with reference to FIG. 1 or the sensor/transducer devices 30 previously described with reference to FIG. 2. In additional embodiments, at least some of the sensor/transducer devices of the device 50 shown in FIG. 4 may comprise the sensor/transducer devices 40 previously described with reference to FIG. 3, or any of the additional sensor/transducer devices described herein below.

Each nanotube 12 of the sensor/transducer devices described herein may exhibit one or more (e.g., harmonics) resonant frequencies that are at least partially a function of the length, diameter, wall thickness and composition of the nanotube 12. Furthermore, each nanotube 12 may be relatively more sensitive to frequencies corresponding to the resonant frequencies thereof. Therefore, in some embodiments, a plurality of devices, each having a nanotube 12 exhibiting a different resonant frequency, may be used to provide a high fidelity sensor and/or transducer having a sensitivity to a relatively broader range of frequencies.

Figure 5:
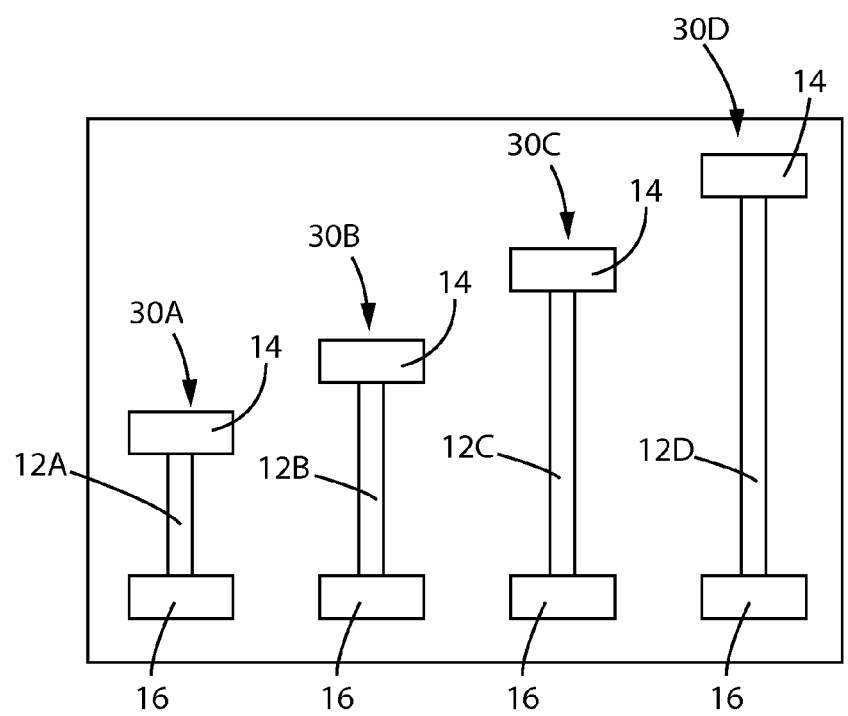
FIG. 5 is a top plan view of a fifth embodiment of a sensor/transducer device of the present invention that includes a plurality of nanotube sensors having varying lengths.

By way of example and not limitation, the device 50 shown in FIG. 4 may be modified such that each of the individual sensor/transducer devices 30 is replaced with a plurality of individual sensor/transducer devices 30A, 30B, ... 30$n$, where n is any integer, each of the individual sensor/transducer devices 30A-30$n$ having a nanotube 12 that exhibits a different resonant frequency or series of frequencies. For example, as shown in FIG. 5, each individual sensor/transducer device 30 of the device 50 (FIG. 4) may be replaced with four individual sensor/transducer devices 30A, 30B, 30C, and 30D, each of which has a respective nanotube 12A, 12B, 12C, and 12D. As shown in FIG. 5, each of the nanotubes 12A, 12B, 12C, and 12D may be caused to exhibit a different base or harmonic resonant frequency by, for example, forming the nanotubes 12A-12D to have different lengths. For example, the length of the nanotube 12B may be greater than the length of the nanotube 12A, the length of the nanotube 12C may be greater than the length of the nanotube 12B, and the length of the nanotube 12D may be greater than the length of the nanotube 12C. In additional embodiments, the nanotubes may be provided with any number of lengths. Furthermore, the resonant frequencies of the nanotubes also may be varied by varying other features of the nanotubes other than length that affect the resonant frequency thereof (e.g., the diameter, the wall thickness and the composition of the nanotubes 12A-12D).

By using nanotubes 12 having different resonant frequencies as described above in relation to FIG. 5, the frequency band sensitivity of the device 50 shown in FIG. 4 may be improved. In other words, the number of frequencies of mechanical vibrations or waves that may be sensed or generated using the device 50 may be increased.

In additional embodiments of the invention, the frequency band sensitivity of individual sensor/transducer devices (such as, for example, the sensor/transducer device 30 shown in FIG. 2) may be selectively variable. For example, another embodiment of a sensor/transducer device 60 of the present invention is shown in FIGS. 6A and 6B that includes a nanotube 12, the base resonant frequency and harmonics of which can be selectively adjusted.

Figure 6A:
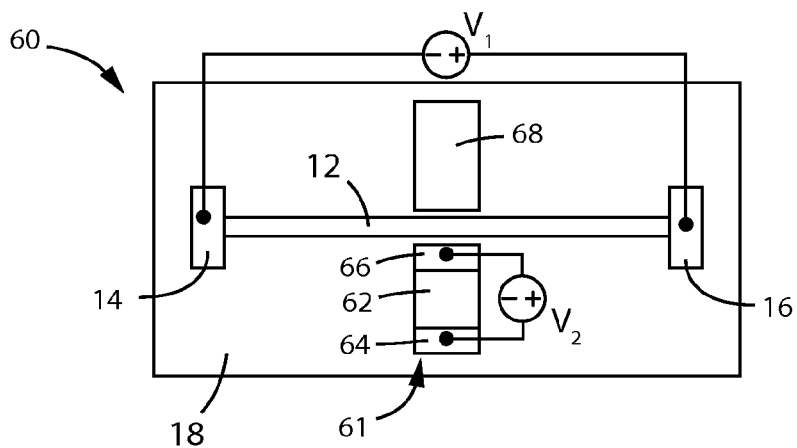
FIGS. 6A and 6B are top plan views of a sixth embodiment of a sensor/transducer device of the present invention that includes a piezoelectric device configured to selectively adjust or tune an operating characteristic of the sensor/transducer device.
Figure 6B:
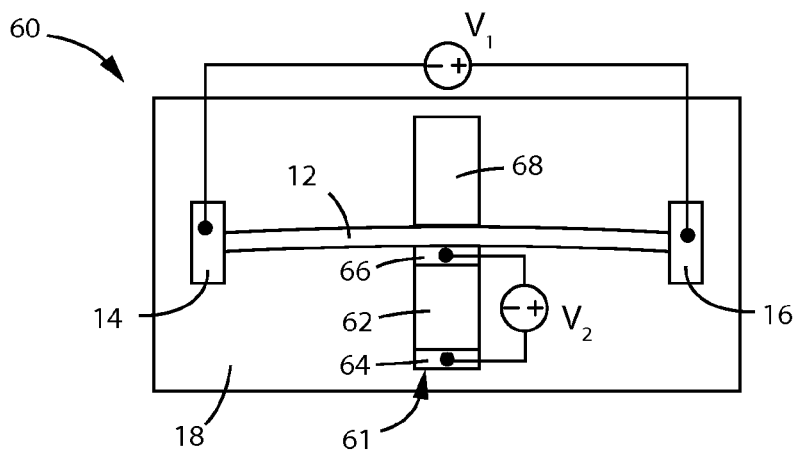

Referring to FIG. 6A, the sensor/transducer device 60 includes a nanotube 12 extending between a first electrode 14 and a second electrode 16 in a manner substantially identical to that previously described in relation to the sensor/transducer device 30 shown in FIG. 2. Mechanical waves or vibrations passing through the substrate 18 or a medium surrounding the nanotube 12 may cause movements in the nanotube 12, and these movements in the nanotube 12 may be detected by, for example, applying a voltage $V_1$ across the nanotube 12 between the first electrode 14 and the second electrode 16 and measuring the resulting current passing through the nanotube 12, as previously described herein.

The sensor/transducer device 60 shown in FIG. 6A further includes a piezoelectric element 61 positioned adjacent a section of the nanotube 12 at a location intermediate the first electrode 14 and the second electrode 16. The piezoelectric element 61 may comprise a piezoelectric material 62 disposed between a first electrode 64 and a second electrode 66. As known in the art, piezoelectric materials are materials that will deform mechanically when an electrical field is applied across the material. Piezoelectric materials include, for example, lead zirconate titanate (PZT), barium titanate, and quartz.

The piezoelectric element 61 may be oriented relative to the nanotube 12 such that mechanical deformation of the piezoelectric material 62 induced by applying a voltage $V_2$ between the first electrode 64 and the second electrode 66 will cause the piezoelectric element 61 to impinge on, or abut against, the nanotube 12 in such a manner as to alter a resonant frequency of the nanotube 12. In some embodiments, a support block 68 may be formed on the substrate 18 on a side of the nanotube 12 opposite the piezoelectric element 61, and the piezoelectric element 61 may be aligned with the support block 68 and oriented relative to the nanotube 12, such that the nanotube 12 will be pinched between the support block 68 and the piezoelectric element 61 when the piezoelectric material 62 is mechanically deformed by applying the voltage $V_2$ between the first electrode 64 and the second electrode 66, as shown in FIG. 6B.

By causing the piezoelectric element 61 to impinge on the nanotube 12, a node may be effectively formed at the point of contact between the piezoelectric element 61 and the nanotube 12. Movement of the nanotube 12 at this node may be prevented or hindered by the piezoelectric element 61, and the two resulting sections of the nanotube 12 on each side of the node may move (e.g., vibrate) independently of the other. In other words, nanotube 12 of the sensor/transducer device 60 may effectively behave as though the nanotube 12 were to comprise two separate nanotubes 12, one on each side of the piezoelectric element 61. These two sections of the nanotube 12 may exhibit different resonant frequencies than those exhibited by the nanotube 12 when the piezoelectric element 61 is not impinging on the nanotube 12. As a result, the nanotube 12 may be sensitive to different frequencies when the piezoelectric element 61 is impinging on the nanotube 12 than when the piezoelectric element 61 is not impinging on the nanotube 12. Therefore, the frequency band sensitivity of the sensor/transducer device 60 may be selectively varied by selectively actuating the piezoelectric element 61.

In some embodiments, the piezoelectric element 61 may be located at approximately a midpoint along the nanotube 12 between the first electrode 14 and the second electrode 16. In additional embodiments, the piezoelectric element 61 may be located at approximately an integer multiple of any one of ⅓, ¼, ⅕, . . . 1/i of the distance along the nanotube 12 between the first electrode 14 and the second electrode 16, where i is any positive integer. Furthermore, although only one piezoelectric element 61 is shown in FIGS. 6A and 6B, in additional embodiments, any number of piezoelectric elements 61 may be located along the length of the nanotube 12, as discussed in further detail below.

Optionally, a dielectric material may be provided on one or both of the exterior surface of the nanotube 12 and the exterior surface of the second electrode 66 of the piezoelectric element 61 so as to prevent current from passing between the first electrode 14 and the second electrode 66, or between the second electrode 16 and the second electrode 66. In additional embodiments, however, it may be desirable to provide electrical contact between the second electrode 66 of the piezoelectric element 61 and the nanotube 12, and to monitor any current passing between the first electrode 14 and the second electrode 66, and/or between the second electrode 16 and the second electrode 66.

It is further noted that mechanical strain (e.g., elastic deformation) may be induced in the nanotube 12 of the sensor/transducer device 60, by actuating the piezoelectric element 61 and causing the piezoelectric element 61 to abut against the nanotube 12. As such, the resistivity (and, hence, the conductivity) of the nanotube 12 may be selectively varied by selectively actuating the piezoelectric element 61 and causing the piezoelectric element 61 to abut against the nanotube 12. As a result, the resulting current passing through the nanotube 12 when a given voltage $V_1$ is applied between the first electrode 14 and the second electrode 16 may vary between two states, one state being that in which the piezoelectric element 61 is actuated and impinges on the nanotube 12 and the other being that in which the piezoelectric element 61 is not actuated and does not impinge on the nanotube 12. Therefore, the sensor/transducer device 60 shown in FIGS. 6A and 6B also may be used as a modulation element for modulating current flow, as a switching element for switching current flow, and arrays of such devices may be used to form memory arrays of electronic memory devices and/or logic arrays of electronic signal processor devices.

Any of the previously described sensor/transducer device 10 (FIG. 1), the sensor/transducer device 30 (FIG. 2), and the sensor/transducer device 40 (FIG. 3) also may be provided with one or more piezoelectric elements 61 like that shown in FIGS. 6A and 6B, and may be used as described in relation to the sensor/transducer device 60 with reference to FIGS. 6A and 6B.

Figure 7:
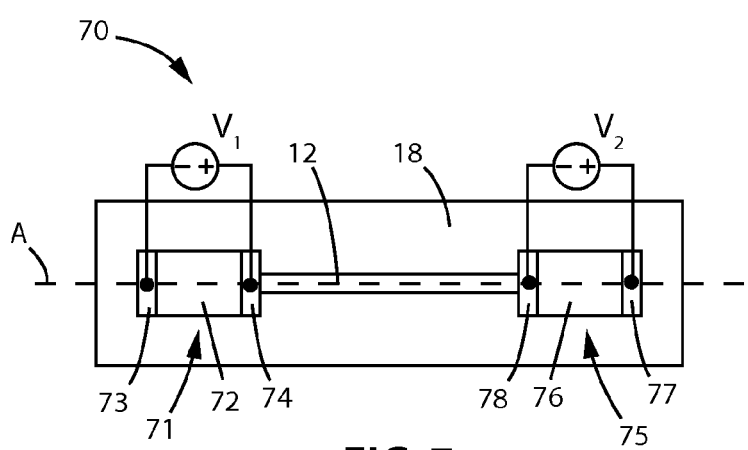
FIG. 7 is a top plan view of a seventh embodiment of a sensor/transducer device that also includes one or more piezoelectric devices configured to selectively adjust or tune an operating characteristic of the sensor/transducer device.

Yet another embodiment of a sensor/transducer device 70 of the present invention is shown in FIG. 7. As shown in FIG. 7, the sensor/transducer device 70 includes a first piezoelectric element 71 and a second piezoelectric element 75. The first piezoelectric element 71 includes a piezoelectric material 72 disposed between a first electrode 73 and a second electrode 74, and the second piezoelectric element 75 similarly includes a piezoelectric material 76 disposed between a first electrode 77 and a second electrode 78. As shown in FIG. 7, the first piezoelectric element 71 and the second piezoelectric element 75 may be formed on a substrate 18 and aligned with one another along an axis A. A nanotube 12 may be formed or otherwise provided between the second electrode 74 of the first piezoelectric element 71 and the second electrode 78 of the second piezoelectric element 75 in a substantially identical manner to that previously described in relation to the nanotube 12 and the first and second electrodes 14, 16 shown in FIG. 2.

In this configuration, a first voltage $V_1$ may be applied between the first electrode 73 and the second electrode 74 of the first piezoelectric element 71 to generate an electric field across the piezoelectric material 72. By selectively adjusting the magnitude and the polarity of the voltage $V_1$, the first piezoelectric element 71 may be caused to selectively mechanically deform (e.g., expand and contract) in a direction substantially parallel to the axis A. Similarly, a second voltage $V_2$ may be applied between the first electrode 77 and the second electrode 78 of the second piezoelectric element 75 to generate an electric field across the piezoelectric material 76. By selectively adjusting the magnitude and the polarity of the voltage $V_2$, the second piezoelectric element 75 also may be caused to selectively mechanically deform (e.g., expand and contract) in a direction substantially parallel to the axis A. By selectively controlling the first voltage $V_1$ and the second voltage $V_2$, slight variations in compressive and tensile strain may be induced along the nanotube 12, which may cause slight variations in the resonant frequencies of the nanotube 12. In other words, the resonant frequencies, as well as the resistivity (and, hence, conductivity), of the nanotube 12 may be selectively adjusted or tuned by selectively varying the first voltage $V_1$ and the second voltage $V_2$.

Furthermore, the sensor/transducer device 70 shown in FIG. 7 may be used as a transducer to generate mechanical movement (e.g., vibrations or waves) in the substrate 18 and/or a medium surrounding the nanotube 12 by selectively controlling a magnitude and polarity of each of the first voltage $V_1$ and the second voltage $V_2$. The sensor/transducer device 70 also may be used as a modulation element or a switching element, as previously described in relation to the sensor/transducer device 60 shown in FIGS. 6A and 6B.

Figure 8:
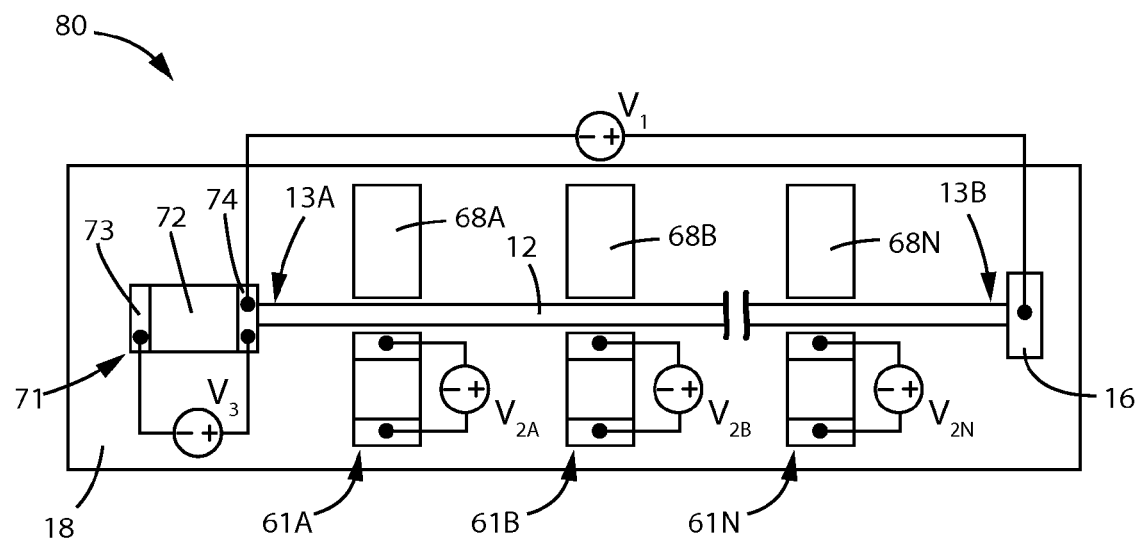
FIG. 8 is a top plan view of an eighth embodiment of a sensor/transducer device that includes a plurality of piezoelectric devices configured to selectively adjust the sensitivity, or otherwise tune a nanotube sensor, and that can be used as a sensor or a transducer.

FIG. 8 is a top plan view of yet another embodiment of a sensor/transducer device 80 of the present invention. The sensor/transducer device 80 includes a plurality of piezoelectric devices each configured to adjust or tune an operating frequency or frequencies of a nanotube 12 of the sensor/transducer device 80. As shown in FIG. 8, the sensor/transducer device 80 may have a first end 13A structurally and electrically coupled to a driving element configured to drive oscillations or vibrations in the nanotube 12. The driving element may comprise, for example, a piezoelectric element 71 that includes a piezoelectric material 72 disposed between a first electrode 73 and a second electrode 74, as previously described in relation to the sensor/transducer device 70 shown in FIG. 7. The first end 13A of the nanotube 12 may be structurally and electrically coupled to the second electrode 74 of the piezoelectric element 71. A second end 13B of the nanotube 12 may be structurally and electrically coupled to another electrode 16. In this configuration, an oscillating or varying voltage $V_3$ may be applied between the first electrode 73 and the second electrode 74 to induce mechanical vibrations in the nanotube 12. Concurrently, a voltage $V_1$ may be applied across the nanotube 12 between the second electrode 74 and the another electrode 16, and the magnitude of the resulting current passing through the nanotube 12 may be monitored. As previously described, deformation of the nanotube 12 may cause the magnitude of the current passing through the nanotube 12 to vary. Therefore, any deflection of the nanotube 12 or vibrations of the nanotube 12 may be detected in the electrical signal (e.g., as a variance in the magnitude of the current passing through the nanotube 12). The sensor/transducer device 80 may be formed on and/or in a substrate 18, and the nanotube 12 may be suspended in air, or the nanotube 12 may be suspended in any other medium including a gas, a liquid, or a solid, or the nanotube 12 may be provided in a vacuum.

Although the piezoelectric element 71 is illustrated as being oriented to drive vibrations in a direction generally parallel to the length of the nanotube 12, in additional embodiments, the piezoelectric element 71 may be oriented to drive vibrations in a direction generally perpendicular to the length of the nanotube 12, or at any other direction relative to the length of the nanotube 12. Furthermore, in yet additional embodiments, both ends 13A, 13B of the nanotube 12 shown in FIG. 8 may be structurally and electrically coupled to a static electrode, or both ends 13A, 13B of the nanotube 12 shown in FIG. 8 may be structurally and electrically coupled to a driving element, such as a piezoelectric element.

With continued reference to FIG. 8, the sensor/transducer device 80 further includes a plurality of piezoelectric elements 61A, 61B, . . . 61N (where N is any positive integer), each being positioned at a location adjacent a section of the nanotube 12 along the length thereof. The piezoelectric elements 61A-61N each may be substantially similar to the piezoelectric element 61 previously described in relation to FIGS. 6A and 6B. Each of the piezoelectric elements 61A-61N may be individually selectively actuated by applying a respective voltage thereto, as illustrated in FIG. 8. For example, the piezoelectric element 61A may be selectively actuated by applying a voltage $V_{2A}$, the piezoelectric element 61B may be selectively actuated by applying a voltage $V_{2B}$, and the piezoelectric element 61N may be selectively actuated by applying a voltage $V_{2N}$. Each of the piezoelectric elements 61A-61N may be oriented relative to the nanotube 12 such that mechanical deformation induced by applying the respective voltages $V_{2A}$–$V_{2N}$ will cause the respective piezoelectric elements 61A-61N to impinge on the nanotube 12 in such a manner as to alter a resonant frequency of the nanotube 12. By way of example and not limitation, a plurality of support blocks 68A-68N may be formed on the substrate 18 on a side of the nanotube 12 opposite the piezoelectric elements 61A-61N, each support block 68A-68N corresponding to and being aligned with one of the piezoelectric elements 61A-61N. In this configuration, the nanotube 12 may be selectively pinched at any one or more of a plurality of locations (the locations between the corresponding support blocks 68A-68N and piezoelectric elements 61A-61N) along the length of the nanotube 12 by selectively applying the voltages $V_{2A}$–$V_{2N}$ to the respective piezoelectric elements 61A-61N.

By selectively and individually actuating the piezoelectric elements 61A-61N, the resonant frequencies of the nanotube 12 may be tuned or adjusted over a relatively broad band of frequencies.

A sensor/transducer device 80 like that shown in FIG. 8 may be used for a number of different applications, including those previously described in relation to the sensor/transducer devices described above. Additionally, the sensor/transducer device 80 may be used as an electronic signal encoder. As previously discussed, a known voltage $V_1$ may be applied between the second electrode 74 and the another electrode 16, and the resulting current flowing through the nanotube 12 between the second electrode 74 and the another electrode 16 may be used to generate an electrical signal. Vibrations then may be induced in the nanotube 12. The characteristics of the electrical signal may vary depending on which, if any, of the piezoelectric elements 61A-61N are actuated so as to impinge on the nanotube 12. Each of the individual piezoelectric elements 61A-61N may be in either of an actuated state (in which the piezoelectric elements 61A-61N impinge on the nanotube 12) or a non-actuated state (in which the piezoelectric elements 61A-61N do not impinge on the nanotube 12). Therefore, the electrical signal between the second electrode 74 and the another electrode 16 may assume any one of a number of "states," depending on which, if any, of the various piezoelectric elements 61A-61N are actuated. It is theoretically possible for the electrical signal to assume as many as $2^N$ different states, where N represents the number of piezoelectric elements 61A-61N in the sensor/transducer device 80. For example, if the sensor/transducer device 80 includes four (4) piezoelectric elements 61A-61N, it would theoretically be possible for the electrical signal to assume as many as $2^4$ (i.e., sixteen (16)) states, each of which is represented in Table 1 below.

TABLE 1

| STATE | 1st Piezoelectric Element | 2nd Piezoelectric Element | 3rd Piezoelectric Element | 4th Piezoelectric Element |
|---|---|---|---|---|
| 1 | Not Actuated | Not Actuated | Not Actuated | Not Actuated |
| 2 | Actuated | Actuated | Not Actuated | Not Actuated |
| 3 | Actuated | Actuated | Actuated | Not Actuated |
| 4 | Actuated | Actuated | Actuated | Actuated |
| 5 | Actuated | Actuated | Not Actuated | Actuated |
| 6 | Actuated | Not Actuated | Not Actuated | Not Actuated |
| 7 | Actuated | Not Actuated | Actuated | Not Actuated |
| 8 | Actuated | Not Actuated | Actuated | Actuated |
| 9 | Actuated | Not Actuated | Not Actuated | Actuated |
| 10 | Not Actuated | Actuated | Not Actuated | Not Actuated |
| 11 | Not Actuated | Actuated | Actuated | Not Actuated |
| 12 | Not Actuated | Actuated | Actuated | Actuated |
| 13 | Not Actuated | Actuated | Not Actuated | Actuated |
| 14 | Not Actuated | Not Actuated | Actuated | Not Actuated |
| 15 | Not Actuated | Not Actuated | Actuated | Actuated |
| 16 | Not Actuated | Not Actuated | Not Actuated | Actuated |

It will be apparent to those of ordinary skill in the art that the sensor/transducer device 80 may be used for base sixteen (16) encoding applications when the sensor/transducer device 80 includes four (4) piezoelectric elements 61A-61N, and hence is capable of assuming any one of 16 different states. It will also be apparent to those of ordinary skill in the art that the sensor/transducer device 80 may be provided with any other number of piezoelectric elements 61A-61N to enable the sensor/transducer device 80 to be used for other types of encoding applications (e.g., base ten (10) encoding applications, base thirty-two (32) encoding applications, etc.).

In some embodiments, the piezoelectric elements 61A-61N may be positioned at locations along the nanotube 12 selected to maximize the total number of resonant frequencies or states that may be exhibited by the nanotube 12. For example, if any of the piezoelectric elements 61A-61N are symmetrically situated at equal length on each side of a midpoint along the length of the nanotube 12, at least some of the states that may be exhibited by the nanotube 12 may be degenerative (i.e., the same or duplicative). Therefore, in some embodiments, the piezoelectric elements 61A-61N may be located asymmetrically about a midpoint of the nanotube 12, the piezoelectric elements 61A-61N may each be situated along only the nanotube 12 on only one side of a midpoint of the nanotube 12, or they may be positioned in any other configuration that reduces or minimizes a number of degenerative states that may be exhibited by the nanotube 12.

The various embodiments of sensor/transducer devices previously described herein may be fabricated using methods known to those of ordinary skill in the art of microdevice and nanodevice fabrication. For example, the sensor/transducer devices may be formed lithographically in a layer-by-layer process. Such processes generally include forming full or partial layers of material on and/or in a surface of a substrate, and selectively patterning the layers (e.g., removing selective portions of the layers) as necessary or desired to form the individual elements and structures of the sensor/transducer devices being formed. By way of example and not limitation, layers of conductive material (e.g., metals and doped semi-conductor materials) may be deposited using, for example, one or more of physical vapor deposition (PVD) techniques, chemical vapor deposition (CVD) techniques, atomic layer deposition (ALD) techniques, electroplating techniques, and electroless plating techniques. Layers of dielectric oxide materials (i.e., materials that are electrically insulative) may be deposited using, for example, physical vapor deposition (PVD) techniques, they may be formed by depositing a metal layer and subsequently oxidizing the metal layer, or they may be formed by depositing another oxide precursor material (e.g., tetraethylorthosilicate (TEOS)) and causing the precursor material to undergo a chemical reaction to form an oxide material (e.g., silica ($SiO_2$). Etching processes, including wet (e.g., chemical) etching processes and dry (e.g., plasma) etching processes, may be used to remove layers of material or regions of layers of material. Furthermore, such etching processes may be isotropic or anisotropic as necessary or desired. Patterned mask layers may be used to protect selected portions of layers of material, while one or more etching processes are used to remove other selected portions of the layers of material layers. Photolithography, imprint lithography (e.g., nanoimprint lithography), electron beam lithography, ion beam lithography, or any other method, including the use of pitch multiplication techniques to achieve sub-lithographic feature resolution may be used to selectively pattern any layer of material (e.g., layers of conductive material, layers of semiconductive material, layers of dielectric material, and mask layers) as necessary or desired. These processes are set forth as non-limiting examples only and are known to those of ordinary skill in the art. The particular methods selected will depend on the materials that are desired to be used to form the sensor/transducer devices.

Furthermore, in the embodiments of sensor/transducer devices previously described herein, the nanotubes may be formed in situ during fabrication of the sensor/transducer devices, or they may be formed elsewhere and positioned on and operably coupled with the sensor/transducer devices. By way of example and not limitation, nanotubes may be formed using arc-discharge methods, laser ablation methods, or chemical vapor deposition (CVD) methods. For example, in arc-discharge methods, carbon atoms may be evaporated by plasma of helium gas that is ignited by high currents passing between a carbon anode and an opposing carbon cathode, and may be used to form both carbon multi-walled nanotubes (MWNTs) and carbon single wall nanotubes (SWNTs). The anode may be doped with a catalyst material (e.g., cobalt or nickel) to form single wall nanotubes (SWNTs) of carbon using arc-discharge methods. As another non-limiting example, a carbon target containing a small amount (e.g., about one-half of one atomic percent (0.5 at %)) of catalyst material (e.g., cobalt or nickel) may be ablated with a laser to form single wall nanotubes (SWNTs) of carbon. As a non-limiting example of a chemical vapor deposition (CVD) method that may be used to form nanotubes, a catalyst material (e.g., nanoparticles comprising iron, nickel, cobalt, another transition metal, or alloys of such transition metals) may be heated to high temperatures (e.g., between about five hundred degrees Celsius (500° C.) and about one thousand degrees Celsius (1,000° C.) in a reactor chamber. A hydrocarbon gas (e.g., ethylene or acetylene) may be flowed through the reactor chamber for a period of time.

As will be apparent to those of ordinary skill in the art, a number of embodiments of devices that employ one or more nanotubes and that may be used as sensors for detecting mechanical displacements or vibrations, as transducers for generating mechanical displacements or vibrations, or as both sensors and transducers, are encompassed by the present invention. Such embodiments may be used to provide sensor/transducer devices that may be relatively more sensitive to a broad range of frequencies, and that may be tunable to particular resonant frequencies.

Although embodiments of the invention have been described as including nanotubes, it is also contemplated that nanowires may be used in place of, or in addition to, nanotubes, so long as the electrical and physical properties of the nanowires allow the resulting sensor/transducer devices to function as described herein. As used herein, the term "nanowire" means any substantially solid elongated structure having transverse cross-sectional dimensions averaging less than about 50 nanometers. For example, it is contemplated that nanowires comprising zinc oxide (ZnO), another II-VI type semiconductor material, a III-V type semiconductor material, or a doped silicon or germanium material, may exhibit electrical and physical properties that would enable a sensor/transducer device as described herein, but including such a nanowire, to function as described herein.

Embodiments of the invention may be used in a variety of applications including, for example, sound detection and generation, monitoring of structural integrity in buildings, bridges, dams, vehicular components and other structures, monitoring of microelectronic devices for defects, monitoring of seismic activity (e.g., earthquake detection and characterization), measurement of strain in materials, and many others. Furthermore, embodiments of the invention may be embedded in buildings, bridges, dams, vehicular components, microelectronic devices, or any other material or structure to facilitate their use in such applications. As specific, non-limiting examples, embodiments of devices of the present invention may be employed, without limitations, in accelerometers, microphones, speakers, switches, modulators, vibration sensors, motion sensors, deformation and displacement sensors, vibrators, stability control and motion compensation systems for vehicles, weapons and cameras.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. A sensor/transducer device, comprising:
   at least one nanotube having a first end structurally and electrically coupled to a first electrode and a second end structurally and electrically coupled to a second electrode; and
   at least one element located laterally adjacent the at least one nanotube and configured to adjust a resonant frequency of the at least one nanotube by bearing on a lateral side surface of the at least one nanotube.

2. The device of claim 1, wherein the at least one nanotube comprises a plurality of nanotubes, each nanotube of the plurality of nanotubes having a first end structurally and electrically coupled to a respective first electrode of a plurality of first electrodes and a second end structurally and electrically coupled to a respective second electrode of a plurality of second electrodes.

3. The device of claim 2, wherein the nanotubes of the plurality of nanotubes exhibit a plurality of different resonant frequencies.

4. The device of claim 3, wherein the nanotubes of the plurality of nanotubes have varying lengths.

5. The device of claim 1, wherein the at least one element comprises at least one piezoelectric element.

6. The device of claim 5, wherein the at least one piezoelectric element comprises a plurality of piezoelectric elements, each piezoelectric element of the plurality of piezoelectric elements configured to impinge on the at least one nanotube at a different location along a length of the at least one nanotube.

7. A sensor/transducer device comprising a plurality of nanotubes configured to exhibit a plurality of resonant frequencies, each nanotube of the plurality of nanotubes having at least a first end structurally and electrically coupled to an electrode, wherein at least one nanotube of the plurality of nanotubes has a first length, at least one nanotube of the plurality of nanotubes has a second length differing from the first length, at least one nanotube of the plurality of nanotubes being oriented in a first direction, and at least one nanotube of the plurality of nanotubes being oriented in a second direction oriented at an angle relative to the first direction.

8. The device of claim 7, wherein each nanotube of the plurality of nanotubes has a second end structurally and electrically coupled to another electrode.

9. The device of claim 8, further comprising additional electrodes, each positioned proximate an intermediate section of a corresponding nanotube of the plurality of nanotubes, each of the additional electrodes configured to affect or sense a capacitance between each of the additional electrodes and the corresponding nanotubes.

10. The device of claim 7, further comprising additional electrodes, each positioned proximate a second end of a corresponding nanotube of the plurality of nanotubes, each of the additional electrodes configured to affect or sense a capacitance between each of the additional electrodes and the corresponding nanotubes.

11. The device of claim 7, further comprising a plurality of piezoelectric elements, each configured to adjust a resonant frequency of at least one nanotube of the plurality of nanotubes.

12. A method of sensing mechanical movement in a medium, the method comprising adjusting a resonant frequency of at least one nanotube in the medium while measuring at least one electronic characteristic of the at least one nanotube, wherein adjusting a resonant frequency of the at least one nanotube comprises causing at least one element to impart a force on a lateral side surface of at least a portion of the at least one nanotube.

13. The method of claim 12, wherein measuring at least one electronic characteristic of the at least one nanotube comprises measuring a capacitance between the at least one nanotube and an electrode located proximate the at least one nanotube.

14. The method of claim 12, wherein adjusting a resonant frequency of the at least one nanotube comprises generating a tensile or compressive stress in at least a portion of the at least one nanotube.

15. A device, comprising:
   at least one nanotube carried by a substrate;
   at least one electrode in electrical contact with the at least one nanotube; and
   at least one actuable structure carried by the substrate and configured to abut against a lateral side surface of the at least one nanotube in an actuated position.

16. The device of claim 15, wherein the at least one actuable structure is configured to impart a variable force on the lateral side surface of the at least one nanotube.

17. The device of claim 15, wherein the at least one actuable structure comprises at least one piezoelectric element.

18. The device of claim 17, wherein the at least one piezoelectric element is configured to abut against the at least one nanotube at an intermediate location along a length of the at least one nanotube.

19. The device of claim 18, wherein the at least one piezoelectric element comprises a plurality of piezoelectric elements, each configured to abut against the at least one nanotube at a different location along the length of the at least one nanotube.

20. A method of encoding, comprising:
    applying a voltage to a nanotube; and
    encoding an electrical signal by adjusting an electrical characteristic of the nanotube using at least one device configured to apply a mechanical force to the nanotube while passing electrical current through the nanotube.

21. The method of claim 20, further comprising selecting the at least one device configured to apply a mechanical force to the nanotube to comprise a piezoelectric device.

22. The method of claim 20, further comprising inducing vibrations in the nanotube.

23. A sensor/transducer device, comprising at least one element located laterally adjacent at least one nanotube and configured to adjust a resonant frequency of the at least one nanotube by bearing on a lateral side surface of the at least one nanotube.

24. The device of claim 23, wherein the at least one element comprises at least one piezoelectric element.

25. The device of claim 23, wherein the at least one element comprises a plurality of elements, each element of the plurality of elements configured to impinge on the at least one nanotube at a different location along a length of the at least one nanotube.

* * * * *